(12) United States Patent
Oshio et al.

(10) Patent No.: US 7,531,845 B2
(45) Date of Patent: May 12, 2009

(54) SEMICONDUCTOR LIGHT EMITTING DEVICE

(75) Inventors: Hiroaki Oshio, Kanagawa-ken (JP);
Iwao Matsumoto, Fukuoka-ken (JP);
Mitsuhiro Nawashiro, Aichi-ken (JP)

(73) Assignees: Kabushiki Kaisha Toshiba, Tokyo (JP);
Toyoda Gosei Co., Ltd, Aichi-ken (JP)

( * ) Notice: Subject to any disclaimer, the term of this patent is extended or adjusted under 35 U.S.C. 154(b) by 0 days.

(21) Appl. No.: 11/765,077

(22) Filed: Jun. 19, 2007

(65) Prior Publication Data

US 2008/0054287 A1 Mar. 6, 2008

(30) Foreign Application Priority Data

Aug. 31, 2006 (JP) .............................. 2006-235744

(51) Int. Cl.
*H01L 33/00* (2006.01)
(52) U.S. Cl. ............................ 257/98; 257/99; 257/100; 438/27; 438/64
(58) Field of Classification Search .................... 257/99, 257/100, 787; 438/27, 64, 65
See application file for complete search history.

(56) References Cited

U.S. PATENT DOCUMENTS

| | | | | |
|---|---|---|---|---|
| 6,737,681 | B2 * | 5/2004 | Koda | 257/98 |
| 2003/0222205 | A1 * | 12/2003 | Shoji | 250/214 R |
| 2004/0156195 | A1 | 8/2004 | Robertson et al. | |
| 2005/0133808 | A1 | 6/2005 | Uraya et al. | |
| 2005/0162069 | A1 | 7/2005 | Ota et al. | |
| 2006/0038477 | A1 * | 2/2006 | Tamaki et al. | 313/485 |
| 2006/0186425 | A1 | 8/2006 | Yano et al. | |
| 2006/0267042 | A1 | 11/2006 | Izuno et al. | |

FOREIGN PATENT DOCUMENTS

JP 2005-136379 5/2005

\* cited by examiner

*Primary Examiner*—Zandra Smith
*Assistant Examiner*—Paul E Patton
(74) *Attorney, Agent, or Firm*—Amin, Turocy & Calvin, LLP

(57) ABSTRACT

A semiconductor light emitting device includes: a body having a recess, a step being provided on a side wall of the recess; a semiconductor light emitting element mounted in the recess; and a resin layer. The resin layer covers at least a portion of an inner surface of the recess of the body. The resin layer has a higher reflectivity than the inner surface of the recess of the body.

20 Claims, 8 Drawing Sheets

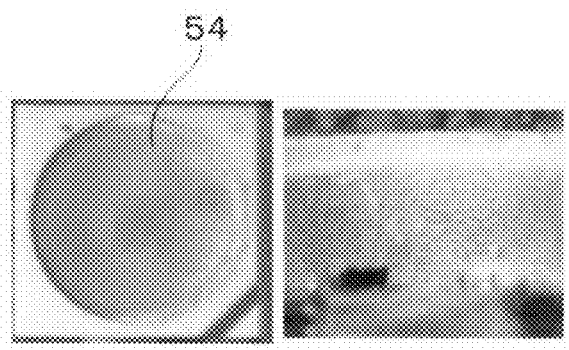
FIG. 6A   FIG. 6B
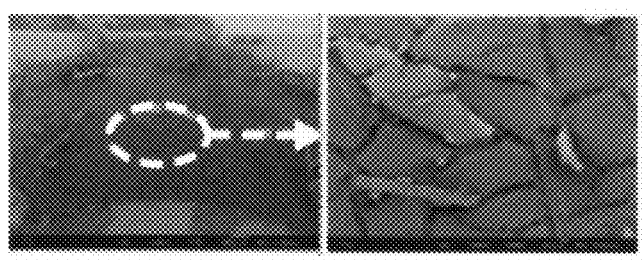   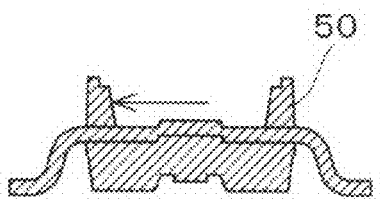
FIG. 6C   FIG. 6D   FIG. 6E

US 7,531,845 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2006-235744, filed on Aug. 31, 2006; the entire contents of which are incorporated herein by reference.

BACKGROUND

Application of semiconductor light emitting devices is rapidly expanding to vehicle-mounted or other lamps, liquid crystal display backlights, and various indicators. To respond to these applications, semiconductor light emitting devices based on semiconductor light emitting elements for emitting blue or ultraviolet radiation have marked a tremendous advance in optical output. Semiconductor light emitting devices for these applications are often implemented as surface mount devices (SMD) for downsizing purposes.

An SMD-type semiconductor light emitting device includes a molded body of thermoplastic resin, a lead, a sealing resin, and a semiconductor light emitting element.

However, with the increasing output of light emitting elements, it turns out that the optical output from such a semiconductor light emitting device tends to decrease over time.

JP 2005-136379 discloses a semiconductor device having a coating member not in contact with the semiconductor light emitting element for preventing the decrease of reflectivity and optical output and preventing the peeling of the semiconductor element and the constituent members of the molded package.

SUMMARY

According to an aspect of the invention, there is provided a semiconductor light emitting device, including: a lead; a body enclosing at least a part of the lead, the body having a recess, a step being provided on a side wall of the recess; a semiconductor light emitting element mounted on the lead exposed inside the recess; a resin layer covering at least a portion of an inner surface of the recess of the body and having a higher reflectivity than the inner surface of the recess of the body; and a sealing resin provided in the recess to enclose the resin layer and the semiconductor light emitting element.

According to another aspect of the invention, there is provided a semiconductor light emitting device including: a body having a recess, a step being provided on a side wall of the recess; a semiconductor light emitting element mounted in the recess; and a resin layer covering at least a portion of an inner surface of the recess of the body and having a higher reflectivity than the inner surface of the recess of the body.

BRIEF DESCRIPTION OF THE DRAWINGS

FIG. 6 is a photograph showing the change of resin in a comparative example.

DETAILED DESCRIPTION OF THE INVENTION

An embodiment of the invention will now be described with reference to the drawings.

Figure 1A:
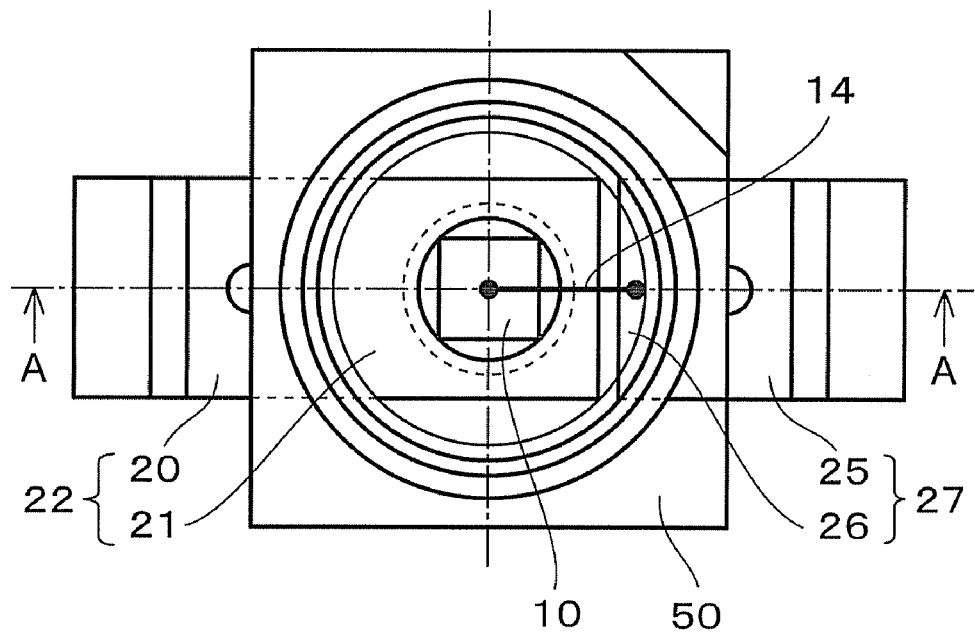
FIG. 1 shows a semiconductor light emitting device according to a first example.
Figure 1B:
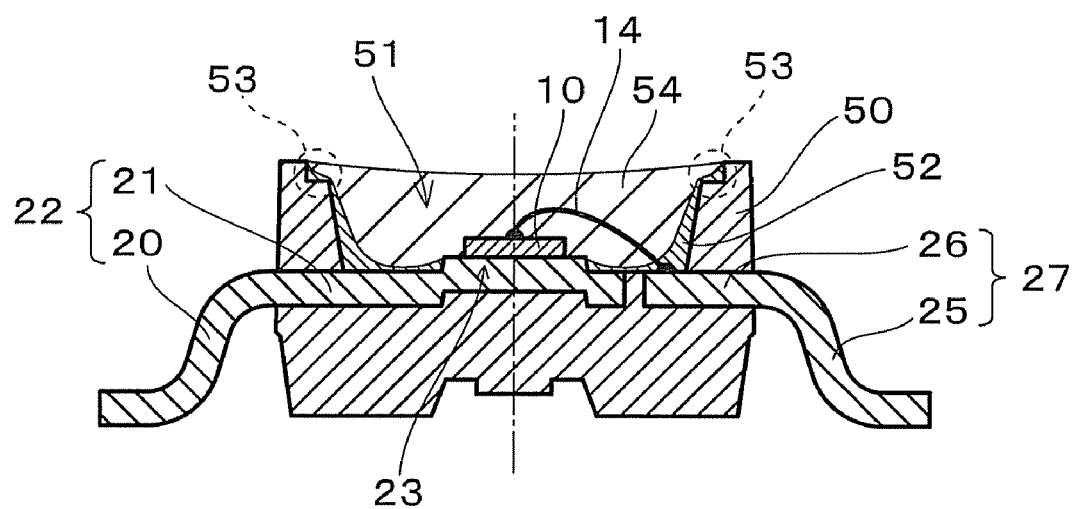

FIG. 1A is a schematic plan view of a semiconductor light emitting device according to a first example of the invention, and FIG. 1B is a schematic cross-sectional view taken along the dot-dashed line AA.

The semiconductor light emitting device includes at least a semiconductor light emitting element 10, a body 50 and a reflective filler-containing resin layer 52. More specifically, the semiconductor light emitting device may include a first lead 22, a second lead 27, a molded body 50 made of thermoplastic resin or the like, a reflective filler-containing resin layer 52, and a sealing resin 54. For ease of description, the reflective filler-containing resin layer 52 and the sealing resin 54 are not shown in FIG. 1A.

The first lead 22 is integrally molded with the molded body 50 of thermoplastic resin, and includes an inner lead 21 and an outer lead 20 outside thereof. The second lead 27, integrally molded in the same way, also includes an inner lead 26 and an outer lead 25. At the tip of the inner lead 21 of the first lead 22, the semiconductor light emitting element 10 is mounted with conductive adhesive or eutectic solder such as AuSn. The electrode (not shown) of the semiconductor light emitting element 10 is connected to the tip of the inner lead 26 of the second lead 27 through a bonding wire 14. If no electrical connection is needed on the backside of the semiconductor light emitting element 10, the semiconductor light emitting element 10 may be mounted using nonconductive adhesive instead of conductive adhesive.

The thermoplastic resin may be heat resistant resin such as polyphthalamide (PPA) or other nylon resin, polyphenylene sulfide (PPS), or liquid crystal polymer. Depending on the type of such thermoplastic resin, an appropriate molding method is selected from among insert molding, injection molding, extrusion molding or the like. In this example, the molded body 50 is formed by insert molding with PPA material. As shown in FIG. 1B, a recess is formed on the backside (lower side in FIG. 1B) of the molded body 50. The recess corresponds to the resin injection port (gate) used for molding the molded body 50. By providing a gate at the bottom of the recess and cutting it from the injected portion, it is possible to prevent burrs at the cut portion from protruding from the backside, and hence to prevent burrs from abutting a packaging member when the semiconductor light emitting device is mounted on the packaging member.

The side wall and the bottom surface of the recess 51 of the molded body 50 of thermoplastic resin, and the inner leads 21 and 26 exposed to the recess 51 are covered with the reflective filler-containing resin layer 52 except in the neighborhood of the semiconductor light emitting element 10. The reflective filler-containing resin layer 52 can be made of resin such as silicone resin, epoxy resin, acrylic resin, or acrylate resin.

The reflective fillers can be made of potassium titanate or titanium oxide, for example, having high reflectivity in the blue wavelength band. Here, if the reflective fillers account for 25% by weight or more, application of liquid resin is difficult because of too high viscosity. If the reflective fillers account for 5% by weight or less, the resin is too soft and excessively spreads after application. Furthermore, the optical transmissivity becomes too high, and the transmitted light into the molded body 50 of thermoplastic resin excessively increases. Therefore the amount of reflective fillers is preferably in the range of 5 to 25% by weight of the reflective filler-containing resin 52.

The reflective filler can be shaped spherical or fibrous, for example. In the fibrous case, the length can be about 5 to 30 μm. A fibrous reflective filler can have a relatively small specific gravity, and hence can reduce the sedimentation of reflective fillers in the reflective filler-containing resin layer 52.

The recess 51 is filled with sealing resin 54 so as to enclose the reflective filler-containing resin layer 52, the semiconductor light emitting element 10, and the bonding wire 14. The sealing resin 54 can be made of silicone resin, epoxy resin, acrylic resin, or acrylate resin, for example. After the filling, the sealing resin 54 is formed by heat curing at 100° C. or more.

A step 53 is provided along the circumference of the recess 51. The resin layer 52 covers an entire inner surface of the recess 51 below the step 53. The step 53 facilitates leaving the reflective filler-containing resin layer 52 on the upside of the side wall of the recess 51. The step 53 can alleviate thermal stress that may cause peeling between the thermoplastic resin and the sealing resin in the reflow mounting process and temperature cycling.

Figure 2:
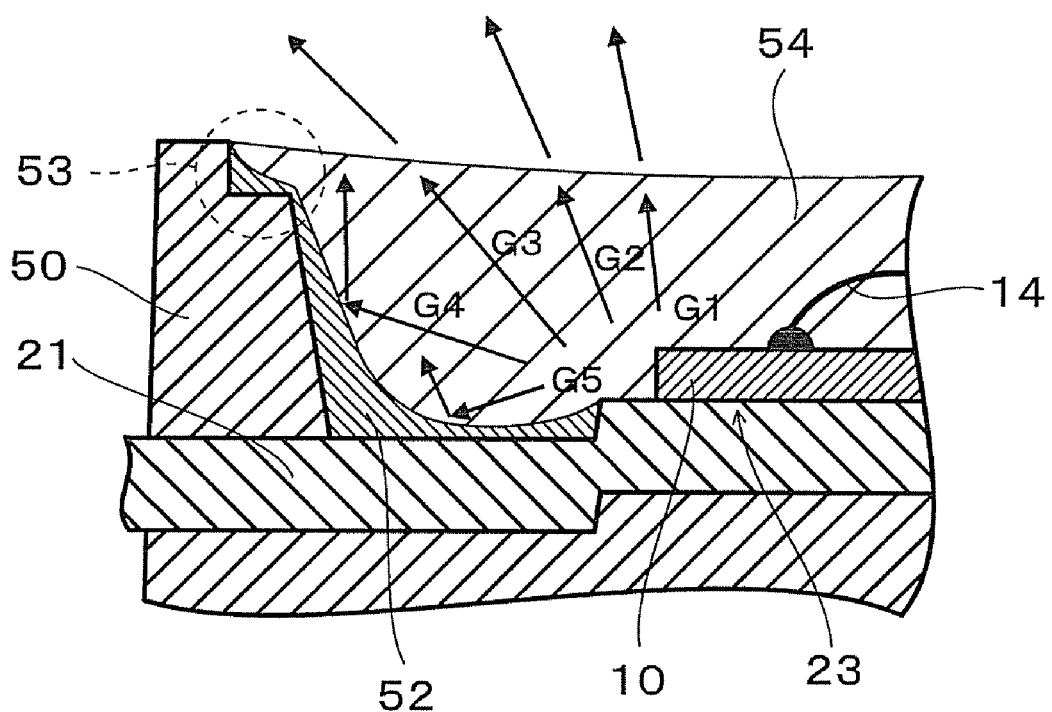
FIG. 2 is a schematic cross-sectional view for illustrating the function of the reflective filler-containing resin layer 52.

FIG. 2 is a schematic cross-sectional view for illustrating the function of the reflective filler-containing resin layer 52.

The semiconductor light emitting element 10 made of nitride semiconductor $B_x In_y Ga_z Al_{1-x-y-z}N$ (where $0 \leq x \leq 1$, $0 \leq y \leq 1$, $0 \leq z \leq 1$, $x+y+z \leq 1$), for example, emits rays of light in the wavelength range of ultraviolet to green.

Among these rays, G1, G2, and G3 are emitted upward of the sealing resin 54. On the other hand, most of the laterally emitted rays represented by G4 are reflected from the reflective filler-containing resin layer 52 covering the side wall of the recess 51 and directed upward. Most of the emitted rays represented by G5 toward the bottom surface of the recess 51 are incident on the reflective filler-containing resin layer 52 and directed obliquely upward or upward. Most of G4 and G5 are emitted outside after reflection, and hence the light extraction efficiency can be increased.

Phosphors may be dispersed in the sealing resin 54 to absorb ultraviolet to blue radiation emitted from the semiconductor light emitting element 10, and wavelength-converted light can be obtained from the excited phosphors. Thus, it is possible to obtain a mixed color of blue light from the semiconductor light emitting element 10 and yellow light wavelength-converted by yellow phosphors, for example. Here, in FIG. 2, part of G4 and G5 is wavelength-converted by phosphors after being reflected from the reflective filler-containing resin layer 52. If the blue light has a wavelength of 450 nm and the emission spectrum from excited yellow phosphors has a peak around 580 nm, then white light is obtained as a mixed color.

An example yellow phosphor is silicate phosphor expressed by the chemical composition formula $(Me_{1-y}Eu_y)_2 SiO_4$ (where Me includes at least one of Ba, Sr, Ca, and Mg, and $0 \leq y \leq 1$). White light with richer color rendition is obtained by using orange or red phosphors in addition to yellow phosphors. Thus various colors on the chromaticity diagram according to the CIE (Commission Internationale de l'Eclairage) standard can be realized by appropriately selecting the emission spectrum of phosphors and the emission wavelength of the semiconductor light emitting element 10.

In this example, the reflective filler-containing resin layer 52 reduces the amount of irradiation with blue light on the thermoplastic resin constituting the molded body 50. In general, blue light is well absorbed by thermoplastic resin. With the increase of optical output, the energy absorbed by the thermoplastic resin increases and causes a change in the thermoplastic resin. Recent semiconductor light emitting elements 10 are operable at a current over several hundred mA, which increases the need for reducing the absorption of blue light. In this example, the reflective filler-containing resin layer 52 serves to reduce optical energy absorption in the thermoplastic resin with increasing the light extraction efficiency.

Next, the lead frame is described. In this example, the portion of the inner lead 21, on which the semiconductor light emitting element 10 is mounted, protrudes upward and forms a protrusion 23. That is, the semiconductor light emitting element 10 is mounted on the protrusion 23 of the inner lead 21. This can prevent the reflective filler-containing resin layer 52 from being in contact with the semiconductor light emitting element 10.

For example, when the reflective filler-containing resin layer 52 is applied before the semiconductor light emitting element 10 is mounted on the inner lead 21, the reflective filler-containing resin layer 52 may spread over the mounting portion of the semiconductor light emitting element 10 and interfere with the mounting of the semiconductor light emitting element 10 if the protrusion 23 is not provided. In such a case, when the semiconductor light emitting element 10 has an electrode also on its backside, the reflective filler-containing resin layer 52 is interposed also between this electrode and the inner lead 21, which makes the electrical connection insufficient. Therefore, intrusion of the reflective filler-containing resin layer 52 needs to be avoided also in the bonding region of the inner lead 26 where the bonding wire 14 is bonded.

On the other hand, when the reflective filler-containing resin layer 52 is applied after the semiconductor light emitting element 10 is mounted, the reflective filler-containing resin layer 52 may be intrusively attached to the side wall or upside of the semiconductor light emitting element 10 and obstruct light emission from the semiconductor light emitting element 10 if the protrusion 23 is not provided.

In this example, the inner lead 21 has a protrusion 23, and the semiconductor light emitting element 10 is mounted on the protrusion 23. This can prevent the semiconductor light emitting element 10 from being in contact with the reflective filler-containing resin layer 52. The planar shape of the protrusion 23 may be generally circular as illustrated in FIG. 1A, or may be elliptical, polygonal, or other shapes.

When the lead frame including the first lead 22 and the second lead 27 is made of copper (Cu) alloy, for example, high thermal conductivity is advantageously achieved. Coating on its surface by plating or other methods can increase reflectivity and solder bonding strength. An example coating material is a lamination of nickel (Ni), palladium (Pd), and gold (Au) in this order. In this case, the approximate thickness of nickel, palladium, and gold can be 1 μm, 0.03 μm, and 0.008 μm, respectively.

The first lead 22 and the second lead 27 have a thickness of about 0.25 mm, the protrusion 23 has a height of about 0.1 mm and a diameter of 1 mm, and the recess 51 has a depth of about 0.9 mm. Such a lead frame configuration including the protrusion 23 can be formed by press working.

Figure 3A:
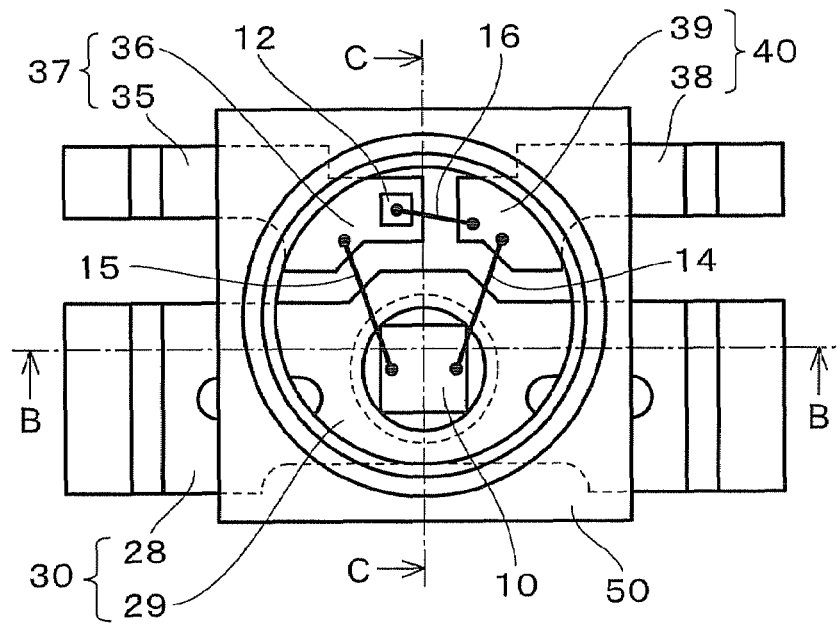
FIG. 3 shows a semiconductor light emitting device according to a second example.
Figure 3B:
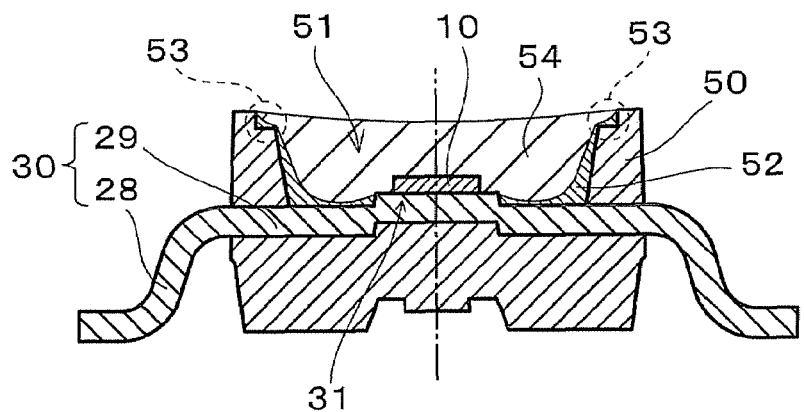
Figure 3C:
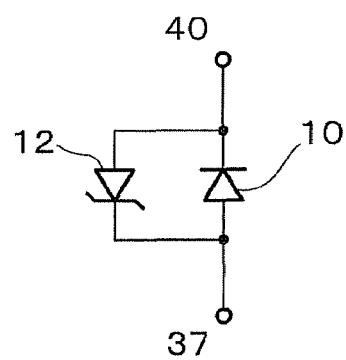

FIG. 3A is a schematic plan view of a semiconductor light emitting device according to a second example, FIG. 3B is a schematic cross-sectional view taken along the dot-dashed line BB, and FIG. 3C shows an equivalent circuit. Components similar to those in FIG. 1 are marked with the same reference numerals and not described in detail.

In this example, the semiconductor light emitting element 10 is mounted on a protrusion 31 of an inner lead 29 constituting a lead 30 with conductive or nonconductive adhesive or eutectic solder such as AuSn. Parallel to the lead 30, a lead 37 and a lead 40 are placed so that the tips are opposed to each other.

At the tip of the inner lead 36 constituting the lead 37 is mounted a Zener diode 12. One of the electrodes of the Zener diode 12 is connected to the tip of the inner lead 39 of the lead 40 through a bonding wire 16. One of the electrodes of the semiconductor light emitting element 10 is connected to the inner lead 36 of the lead 37 through a bonding wire 15, and the other electrode is connected to the inner lead 39 of the lead 40 through a bonding wire 14. As illustrated in FIG. 3C, the lead 37 and the lead 40 serve as the anode and cathode electrode of the semiconductor light emitting element 10, respectively.

The Zener diode 12 protects the semiconductor light emitting element 10 from electrostatic breakdown. That is, when an excessive forward surge is applied to the semiconductor light emitting element 10, the surge exceeding the reverse withstand voltage of the Zener diode 12 is absorbed to protect the semiconductor light emitting element 10.

In this example, the side wall and the bottom surface of the recess 51 of the molded body 50 of thermoplastic resin are covered with the reflective filler-containing resin layer 52 except in the neighborhood of the semiconductor light emitting element 10. Here, the tip of the inner lead 36 and the tip of the inner lead 39 exposed to the bottom surface of the recess 51, and the non-mounting region of the semiconductor light emitting element 10 in the inner lead 29 are covered with the reflective filler-containing resin layer 52. Also in this example, the reflective filler-containing resin layer 52 serves to reduce optical energy absorption in the thermoplastic resin with increasing the light extraction efficiency.

In this example, as viewed in a cross section taken parallel to the dot-dashed line BB and including the center of the semiconductor light emitting element 10, the semiconductor light emitting element 10 has a structure nearly in bilateral symmetry. As a result, stress due to thermal contraction and expansion of the lead 30 and the sealing resin 54 relative to the semiconductor light emitting element 10 becomes bilaterally equalized. This serves to reduce the peeling and cracks of the chip, and to improve reliability.

Figure 4A:
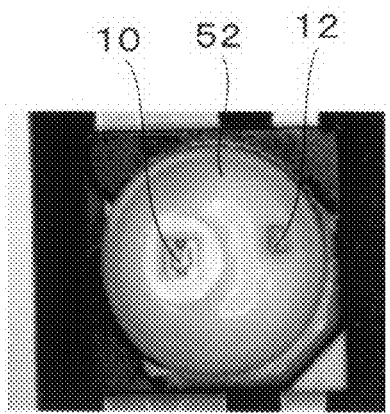
FIG. 4 shows the state obtained after application of reflective filler-mixed resin.
Figure 4B:
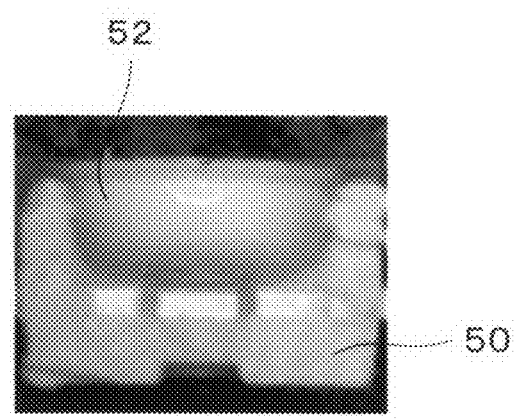

FIG. 4A is a photograph the state obtained after application of reflective filler-mixed resin taken from above, and FIG. 4B is a photograph taken on a cross section of the recess 51.

Reflective filler-mixed resin is applied to the region in the recess 51 except the semiconductor light emitting element 10. Here, in the case of the structure where the inner lead 29 has a protrusion 31 having a diameter of 1 mm on which the semiconductor light emitting element 10 is mounted as shown in FIG. 3, it is possible to prevent the filler-containing liquid resin from being in contact with the semiconductor light emitting element 10 as described above, and the resin can be reliably applied as shown in FIG. 4A.

Furthermore, the recess 51 is filled with resin so as to enclose the semiconductor light emitting element 10, the Zener diode 12, bonding wires 14, 15, 16, and the reflective filler-containing resin 52, and the resin is thermally cured to form a sealing resin 54. As with the first example, it is also possible to disperse phosphors in the sealing resin 54.

Figure 5:
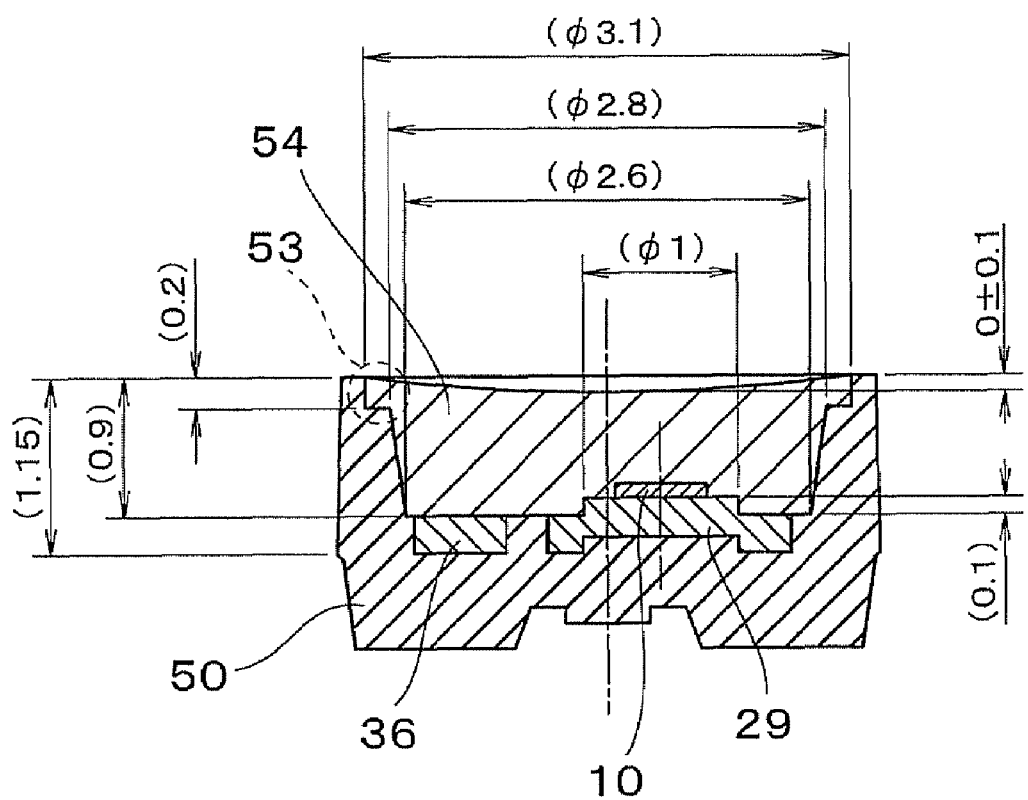
FIG. 5 is a schematic cross-sectional view of the second example.

FIG. 5 is a schematic cross-sectional view taken along the dot-dashed line CC of FIG. 3A.

When a filler-mixed resin layer 52 is applied to the inner surface of the recess 51 of the semiconductor light emitting device, the liquid resin may flow downward. Then the reflective filler-containing resin layer 52 is difficult to remain on the upside portion of the side wall of the recess 51, and the thermoplastic resin is likely to be irradiated with emitted light. To prevent the degradation of resin due to this irradiation, the reflective filler-containing resin layer 52 needs to be left also on the upside of the side wall.

To this end, as shown in FIG. 5, a step 53 along the circumference of the upside of the recess 51 is provided at 0.2 mm from the upside of the molded body 50. Then the reflective filler-containing resin layer 52 is pooled not only at the corner of the bottom of the recess but also at the corner of the step 53 and on the side wall of the recess 51 above the step 53. This facilitates leaving the reflective filler-containing resin layer 52 even on the upside of the side wall of the recess 51. Furthermore, the step 53 can alleviate thermal stress that may cause peeling between the thermoplastic resin and the sealing resin in the reflow mounting process and temperature cycling. The step 53 is not limited to a single step on the side face of the recess 51, but a plurality of steps can be provided. That is, by providing a plurality of steps 53 on the side face of the recess 51, the reflective filler-containing resin layer 52 can be retained more reliably on the side face of the recess 51, and the above effect of alleviating thermal stress can be achieved.

The position of the step 53 may be higher than the highest position of the wire 14, for example, as shown in FIG. 1B, or may be placed between the highest position of the wire 14 and the upside of the semiconductor light emitting element 10 in FIG. 1B. In the case of providing only a single step 53, the reflective filler-containing resin layer 52 can be efficiently left on the side wall of the recess 51 by providing the step 53 around the vertical middle of the side wall of the recess 51. In the case of providing two steps 53, these steps 53 can be suitably provided so as to vertically trisect the side face of the recess 51. The dimensions of the portions shown in FIG. 5 are illustrative only. Larger or smaller dimensions are also possible.

Next, the degradation of thermoplastic resin upon direct irradiation with blue light is described in detail.

First, after energization under the high-temperature condition of 85° C. at an operating current of 150 mA was continued for 1000 hours, the semiconductor light emitting device of this example, which had the reflective filler-containing resin layer 52, yielded a residual brightness ratio of 99%. On the other hand, under the same condition, the residual brightness ratio of the semiconductor light emitting device of a comparative example, which had no reflective filler-containing resin layer, was as low as 90%.

Furthermore, after energization under the high-temperature, high-humidity condition of 60° C./90% at an operating current of 150 mA was continued for 1000 hours, the semiconductor light emitting device of this example yielded a residual brightness ratio of 97%. On the other hand, under the same condition, the residual brightness ratio of the semiconductor light emitting device of the comparative example was as low as 75%. That is, it was confirmed that the operating life can be extended in the present example.

FIG. 6 shows photographs and a schematic view of the comparative example for illustrating the degradation of thermoplastic resin, in which FIG. 6A is a photograph taken from above the sealing resin, FIG. 6B is a photograph of the side wall of the recess of the semiconductor light emitting device degraded after 1000 hours of high-temperature energization, FIGS. 6C and 6D are partially enlarged photographs, and FIG. 6E is a schematic cross-sectional view indicating the position shown in FIG. 6D.

As illustrated in FIG. 6D, in the comparative example, the surface of thermoplastic resin irradiated with blue light is degraded, causing cracks and discoloration. This results in decreased optical reflectivity. Furthermore, peeling between the thermoplastic resin and the sealing resin is more likely to occur. In contrast, in the present example, because the reflective filler-containing resin layer 52 reflects blue light, irradiation of thermoplastic resin can be prevented. Furthermore, because of the stable reflectivity of the reflective filler-containing resin layer 52, the decrease of optical output can be restricted. Peeling between the thermoplastic resin and the sealing resin can be also prevented.

It is also possible to increase the optical reflectivity of the exposed inner lead for increasing the optical reflectivity inside the recess 51.

That is, the surface of the inner lead can be plated with silver (Ag) or gold (Au) to increase the optical reflectivity inside the recess. However, while Ag has a reflectivity as high as 85 to 92% in the wavelength range of 400 to 500 nm, Ag is recrystallized upon irradiation with blue light, and the reflectivity decreases. This causes the decrease of optical output with the lapse of operating time. Furthermore, the outer lead with exposed Ag needs exterior plating with solder or Au plating for antioxidation, which increases component cost. Moreover, while Au is more stable against blue light than Ag, Au has a reflectivity as low as 39 to 58% in the wavelength range of 400 to 500 nm.

In contrast to the method of separately increasing the optical reflectivity of the thermoplastic resin and the inner lead as described above, the present example allows the thermoplastic resin and the inner lead to be commonly covered with reflective filler-containing resin, and hence the process can be simplified. Furthermore, high reliability through extended operating life can be ensured with increasing the light extraction efficiency.

Figure 7A:
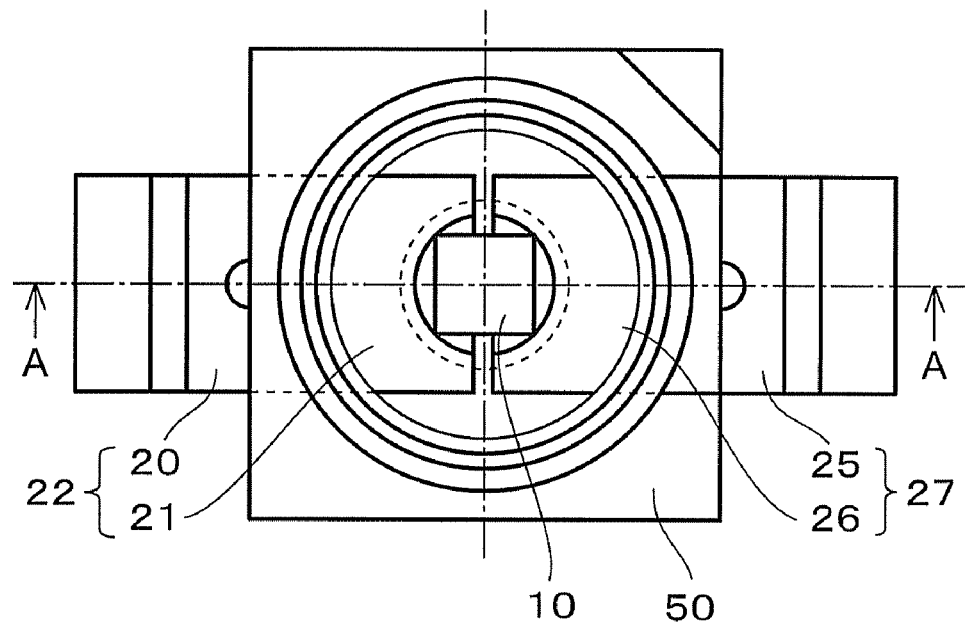
FIG. 7 shows a semiconductor light emitting device according to a third example.
Figure 7B:
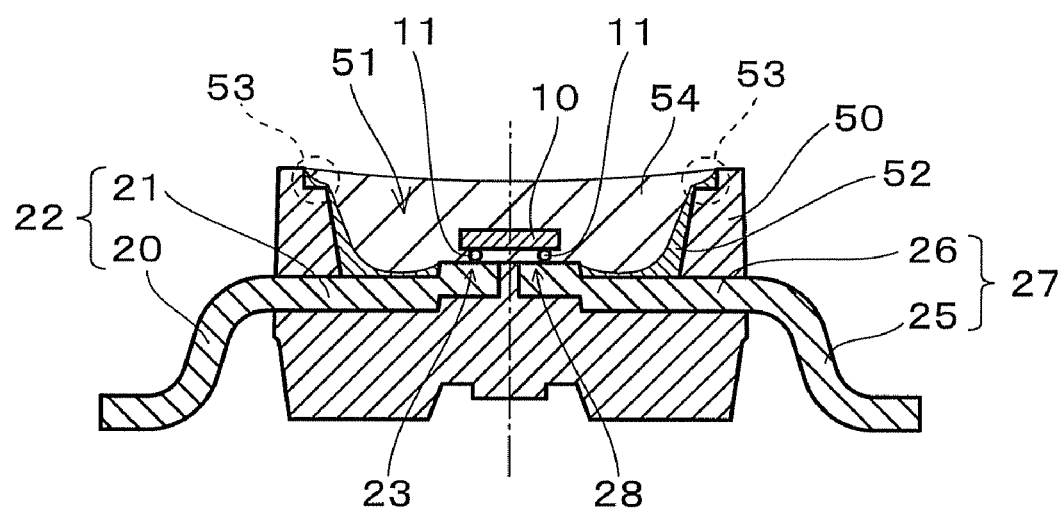

FIG. 7A is a schematic plan view of a semiconductor light emitting device according to a third example, and FIG. 7B is a schematic cross-sectional view taken along the dot-dashed line AA. With regard to FIG. 7, elements similar to those described above with reference to FIGS. 1 to 6 are marked with the same reference numerals and not described in detail.

This example is based on the so-called flip-chip structure. More specifically, a pair of electrodes is formed on the backside of the semiconductor light emitting element 10, and metal bumps 11 are connected to these electrodes, respectively. The metal bumps 11 are connected to the inner leads 21, 26, respectively. That is, the metal bumps 11 serve to mount the semiconductor light emitting element 10 and simultaneously to ensure electrical connection. Also in this flip-chip structure, as described above with reference to FIGS. 1 to 6, the reflective filler-containing resin layer 52 can be provided inside the recess 51 to prevent the degradation and alteration of thermoplastic resin and to achieve stable optical output over a long period of time.

Also in this example, protrusions 23, 28 can be provided on the inner leads 21, 26 to prevent the reflective filler-containing resin layer 52 from being in contact with the semiconductor light emitting element 10. When the metal bumps 11 are formed thick and the process of applying the reflective filler-containing resin layer 52 is performed after mounting the semiconductor light emitting element 10, the protrusions 23, 28 are not necessarily needed to avoid the problems such as the decrease of light extraction due to the contact between the reflective filler-containing resin layer 52 and the semiconductor light emitting element 10 and the contact failure between the semiconductor light emitting element 10 and the lead due to the intervention of the reflective filler-containing resin layer 52.

Next, variations of the outer lead are described.

Figure 8A:
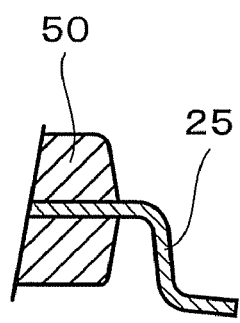
FIG. 8 is a partial schematic cross-sectional view showing variations of the outer lead.
Figure 8B:
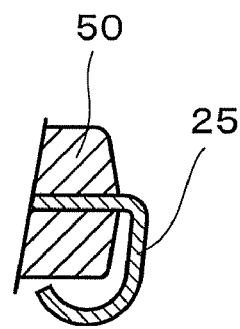
Figure 8C:
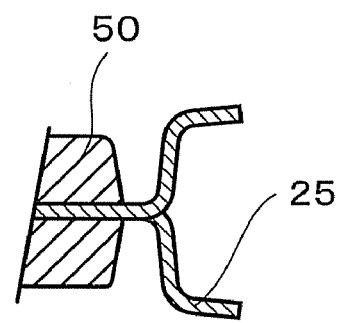

FIG. 8 is a schematic partial cross-sectional view of the neighborhood of the outer lead, in which FIG. 8A shows the example described above, and FIGS. 8B and 8C show variations thereof.

FIG. 8A shows the outer lead 25 of the first example, which is called gull wing or Z-bend. The outer leads shown in FIGS. 8B and 8C are called J-bend and multi-bend, respectively. It is desirable to select an appropriate outer lead configuration from among them depending on the application and the mounting substrate.

In the process of assembling the semiconductor light emitting device, a multi-part lead frame is used for semiconductor element mounting, wire bonding, insert molding, and resin sealing. Then the lead frame is cut, and bent as needed into the above configuration. Thus the semiconductor light emitting device of FIG. 1 or 3 is completed.

In the examples, the semiconductor light emitting device equipped with a semiconductor light emitting element based on nitride semiconductor is described. However, the semiconductor light emitting device may be based on other materials. For example, the semiconductor light emitting device may be equipped with a semiconductor light emitting element in the 500 to 700 nm band, that is, green to red band, based on InGaAlP or AlGaAs.

The embodiment of the invention has been described with reference to the drawings. However, the invention is not limited thereto. For example, the material, shape, and size of the semiconductor element, molded body, resin, filler, phosphor, and lead constituting the semiconductor light emitting device that are variously adapted by those skilled in the art are also encompassed within the scope of the invention as long as they do not depart from the spirit of the invention.

The invention claimed is:

1. A semiconductor light emitting device, comprising:
   a lead;
   a body enclosing at least a part of the lead, the body having a recess, a step being provided on a side wall of the recess;
   a semiconductor light emitting element mounted on the lead exposed inside the recess;
   a resin layer covering at least a portion of an inner surface of the recess of the body and having a higher reflectivity than the inner surface of the recess of the body; and
   a sealing resin provided in the recess to enclose the resin layer and the semiconductor light emitting element, the sealing resin being in contact with the semiconductor light emitting.

2. The semiconductor light emitting device of claim 1, wherein the lead has a protrusion, and the semiconductor light emitting element is mounted on the protrusion of the lead.

3. The semiconductor light emitting device of claim 2, wherein the resin layer is not in contact with the semiconductor light emitting element.

4. The semiconductor light emitting device of claim 1, wherein the step is provided at a vertical middle of the side wall.

5. The semiconductor light emitting device of claim 3, wherein the step is provided at a vertical middle of the side wall.

6. The semiconductor light emitting device of claim 1, wherein the resin layer contains at least one of potassium titanate and titanium oxide.

7. The semiconductor light emitting device of claim 1, wherein the resin layer extends over the step.

8. The semiconductor light emitting device of claim 1, wherein a plurality of the steps are provided on the side wall.

9. The semiconductor light emitting device of claim 1, wherein the resin layer contains at least one of spherical reflective fillers and fibrous reflective fillers.

10. The semiconductor light emitting device of claim 6, wherein the resin contains reflective fillers in an amount in a range of 5 to 25% by weight.

11. The semiconductor light emitting device of claim 1, wherein the resin layer covers an entire inner surface of the recess below the step.

12. A semiconductor light emitting device comprising:
- a body having a recess, a step being provided on a side wall of the recess;
- a semiconductor light emitting element mounted in the recess; and
- a resin layer covering at least a portion of an inner surface of the recess of the body and having a higher reflectivity than the inner surface of the recess of the body,
- wherein the resin layer is not substantially provided on the semiconductor light emitting element.

13. The semiconductor light emitting device of claim 12, wherein the semiconductor light emitting element is mounted on a protrusion provided on a bottom surface of the recess.

14. The semiconductor light emitting device of claim 12, wherein the step is provided at a vertical middle of the side wall.

15. The semiconductor light emitting device of claim 13, wherein the step is provided at a vertical middle of the side wall.

16. The semiconductor light emitting device of claim 12, wherein the resin layer covers an entire inner surface of the recess below the step.

17. The semiconductor light emitting device of claim 12, wherein the resin layer contains at least one of potassium titanate and titanium oxide.

18. The semiconductor light emitting device of claim 12, wherein a plurality of the steps are provided on the side wall.

19. The semiconductor light emitting device of claim 17, wherein the resin contains reflective fillers in an amount in a range of 5 to 25% by weight.

20. The semiconductor light emitting device of claim 1, wherein the resin layer is not substantially provided on the semiconductor light emitting element.

* * * * *